United States Patent
Kajigaya et al.

(10) Patent No.: US 7,544,246 B2
(45) Date of Patent: Jun. 9, 2009

(54) LITHIUM TANTALATE SUBSTRATE AND METHOD OF MANUFACTURING SAME

(75) Inventors: Tomio Kajigaya, Hokkaido (JP); Takashi Kakuta, Hokkaido (JP)

(73) Assignee: Sumitomo Metal Mining Co., Ltd., Tokyo (JP)

(*) Notice: Subject to any disclaimer, the term of this patent is extended or adjusted under 35 U.S.C. 154(b) by 0 days.

(21) Appl. No.: 11/508,105

(22) Filed: Aug. 22, 2006

(65) Prior Publication Data

US 2006/0283372 A1     Dec. 21, 2006

Related U.S. Application Data

(62) Division of application No. 10/819,472, filed on Apr. 6, 2004.

(30) Foreign Application Priority Data

| Apr. 8, 2003 | (JP) | 2003-104176 |
| Dec. 26, 2003 | (JP) | 2003-432472 |
| Mar. 3, 2004 | (JP) | 2004-061862 |

(51) Int. Cl.
C30B 15/00 (2006.01)
H01L 41/00 (2006.01)

(52) U.S. Cl. .............. 117/13; 117/20; 117/32; 117/948; 310/313; 310/344

(58) Field of Classification Search .......... 117/948, 117/13, 20, 32; 310/313, 344
See application file for complete search history.

(56) References Cited

U.S. PATENT DOCUMENTS

| 5,359,452 A | 10/1994 | Nitanda et al. |
| 5,436,757 A | 7/1995 | Okazaki et al. |
| 5,517,942 A * | 5/1996 | Fukuda et al. ............ 117/64 |
| 5,521,750 A * | 5/1996 | Onoe et al. ............ 359/332 |
| 5,539,569 A | 7/1996 | Fukuda et al. |
| 5,650,006 A * | 7/1997 | Kawaguchi et al. ......... 117/54 |
| 5,844,347 A | 12/1998 | Takayama et al. |
| 6,310,423 B1 | 10/2001 | Tanaka et al. |
| 6,319,430 B1 * | 11/2001 | Bordui et al. ............ 252/584 |
| 6,392,234 B2 | 5/2002 | Diekmann |
| 6,628,178 B2 | 9/2003 | Uchikoba |
| 2002/0011568 A1 | 1/2002 | Diekmann |
| 2004/0163596 A1 | 8/2004 | Miles et al. |
| 2004/0255842 A1 * | 12/2004 | Kajigaya et al. ............ 117/2 |
| 2006/0169196 A1 | 8/2006 | Shiono |
| 2006/0283372 A1 | 12/2006 | Kajigaya et al. |
| 2006/0283375 A1 | 12/2006 | Kajigaya et al. |
| 2006/0292706 A1 * | 12/2006 | Tokuda et al. ............ 438/3 |
| 2007/0006797 A1 | 1/2007 | Kajigaya et al. |

FOREIGN PATENT DOCUMENTS

| EP | 0 921 215 | 6/1999 |
| EP | 0 893 515 | 11/2003 |
| JP | 62078196 A * | 4/1987 |
| JP | 11-92147 | 8/1989 |
| JP | 5-124897 | 5/1993 |
| JP | 52-53800 | 4/1997 |
| JP | 11-236298 | 8/1999 |
| JP | 2002111420 A * | 4/2002 |
| JP | 2004-35396 | 2/2004 |
| WO | WO 01/26886 | 4/2001 |
| WO | WO 01/33260 | 5/2001 |
| WO | WO 2004/002891 | 1/2004 |

OTHER PUBLICATIONS

Albert Ballman "Growth of Piezoelectric and Ferroelectric Materials by the Czochralski Technique" Journal of the American Ceramic Society, vol. 48, No. 2, Feb. 1965, pp. 112-113.*
S. Youssef et al., "Characterization of LiTaO3 Thin. Films Fabricated by Sol-Gel Technique", Jan. 2007, Elsevier Science Publishers B.V., vol. 38 Issue 1, pp. 63-66 (Abstract enclosed).*
Derwent-ACC-No. 1979-20670B; Derwent-Week: 197911, Lithium Tanatlite Dielectric Material for use in Electronics . . . .*
"Transparent Conducting Film Technology", Japan Society for the Promotion of Science. Ohm Co. (1999) pp. 55-57.

* cited by examiner

Primary Examiner—Robert M Kunemund
Assistant Examiner—G. Nagesh Rao
(74) Attorney, Agent, or Firm—Katten Muchin Rosenman LLP

(57) ABSTRACT

In a process for manufacturing a LT substrate from a LT crystal, after growing the crystal, a LT substrate in ingot form is imbedded in carbon power, or is place in a carbon vessel, and heat treated is conducted at a maintained temperature of between 650° C. and 1650° C. for at least 4 hours, whereby in a lithium tantalate (LT) substrate, sparks are prevented from being generated by the charge up of an electric charge on the substrate surface, and thereby destruction of a comb pattern formed on the substrate surface and breaks or the like in the LT substrate are prevented.

1 Claim, No Drawings

LITHIUM TANTALATE SUBSTRATE AND METHOD OF MANUFACTURING SAME

CROSS-REFERENCE TO RELATED APPLICATION

This application is a divisional of U.S. application Ser. No. 10/819,472 filed on Apr. 6, 2004, pending and claims priority from Japanese Patent Applications 2003-104176 filed on Apr. 8, 2003, 2003-432472 filed Dec. 26, 2003, and 2004-061862 filed Mar. 5, 2004, the contents of which are hereby incorporated by reference.

TECHNICAL FIELD OF THE INVENTION

The present invention relates to a lithium tantalate (LT) substrate used in surface-acoustic wave elements and the like, and a manufacturing method thereof.

BACKGROUND OF THE INVENTION

A lithium tantalate crystal is a ferroelectric substance, with a melting point of approximately 1650° C. and a Curie point of approximately 600° C., which has piezoelectric properties. Lithium tantalate substrates manufactured from lithium tantalate crystals are used primarily as a material for surface-acoustic wave (SAW) filters used to accomplish signal noise rejection in mobile phones. Factors such as the use of higher frequencies with mobile phones, and the proliferation of Bluetooth (2.45 GHz) as a wireless LAN for a variety of electronic equipment, mean that from now on a rapid increase in demand is anticipated for SAW filters in and around the 2 GHz frequency domain.

In the construction of a SAW filter, a pair of comb electrodes made of a metallic thin film produced from an AlCu alloy or the like, are formed on a substrate made of a piezoelectric material, for example a LT substrate. These comb electrodes have the important function of controlling the polarity of the device. The comb electrodes are formed by depositing a metallic thin film on the piezoelectric material by a sputtering method, and leaving a pair of comb shaped patterns while etching away the unwanted portions using photolithographic techniques.

To be compatible with even higher frequencies, it is necessary for the comb shaped pattern to be fine, as well as thin. Compared to devices operating in and around the 800 MHz frequency domain, which is currently the mainstream, devices operating in and around the 2 GHz frequency domain require a distance between electrodes approximately one third as wide, that is between 0.3 µm and 0.4 µm, and a film thickness less than one fifth as thick, that is below 200 nm or thereabouts.

Industrially, LT crystals are grown using the Czochralski method, normally using a high-melting iridium crucible inside an electric furnace, under a nitrogen-oxygen mixed gas atmosphere with an oxygen concentration between a few percent and 10% or thereabouts, and the crystals are removed from the electric furnace after being cooled at a predetermined cooling rate inside the electric furnace (Albert A. Ballman: Journal of American Ceramic Society, Vol. 48 (1965)).

The process of manufacturing a wafer from a LT crystal involves crystal growing (ingot), poling, cylindrical grinding, slicing, lapping, polishing and wafer completion, in that order.

Specifically, a grown LT crystal is either colorless and transparent, or exhibits a highly transparent pale yellow color. After the LT crystal is grown, heat treatment of the crystal is performed under an even temperature near the melting point to remove residual strain in the crystal caused by thermal stress. In addition, poling is performed to obtain a single polarization. In other words a series of processes is performed involving; heating the LT crystal from room temperature to a predetermined temperature above the Curie point (approximately 600° C.), applying a voltage to the LT crystal, and while applying this voltage, lowering the temperature of the LT crystal to a predetermined temperature below the Curie point, and subsequently stopping voltage application and lowering the temperature of the LT crystal to room temperature. After poling, the LT crystal ingot, which has undergone cylindrical grinding to prepare its external form, is sliced to form wafers, and these wafers undergo machining including lapping and polishing and the like, to obtain LT substrates. The thus obtained LT substrates are nearly colorless and transparent, and have extremely low electrical conductivity, at approximately $10^{-13}$ S/m (volume resistivity $10^{15}$ Ωcm).

A LT crystal, which is a ferroelectric substance, also has pyroelectric properties. Accordingly, when LT substrates are obtained by conventional methods, the temperature variations sustained during the surface acoustic wave device manufacturing process can cause an electric charge to accumulate on the surface of the LT substrate due to the pyroelectric properties of the LT crystal, and this charge can generate sparks. These sparks can destroy the comb pattern formed on the surface of the LT substrate, and cause cracking or the like of the LT substrate, which reduces yield during the surface acoustic wave device manufacturing process. Moreover, because the electrical conductivity of the LT substrate is extremely low as mentioned above, the charge-build-up state is maintained, and a state in which sparking can occur easily continues for extended periods of time.

Furthermore, because the LT substrate has high light transmittance, a problem occurs in that the light which passes into the LT substrate during the photolithographic process, which is one part of the surface acoustic wave device manufacturing process, is reflected from the rear surface of the LT substrate back onto the front surface, causing deterioration of the resolution of the comb pattern formed on the substrate.

In order to solve these problems, in Japanese Patent Publication No. Tokukai Hei 11-92147 and Japanese Patent Publication No. Tokukai Hei 11-236298, a solution is proposed whereby lithium niobate (LN) crystals are exposed to a reducing atmosphere of argon, water, hydrogen, nitrogen, carbon dioxide, carbon monoxide or a mixture of gases selected from this group, at a temperature range of between 500 and 1140° C., thereby blackening the LN crystal wafers and thus controlling the high light transmittance of the LN substrate, while increasing the electrical conductivity, so that light reflected back from the rear surface of the LN substrate is suppressed, and at the same time the pyroelectric properties of the LN substrate are reduced.

Although these publications refer to LT crystals as well as LN crystals, there are no substantial disclosures relating to LT crystals.

Furthermore, according to experiments carried out by the inventors of the present invention, it was discovered that the methods disclosed in these publications were effective with LN crystals that had a low melting point of approximately 1250° C., but had no effect with LT crystals that had a high melting point of approximately 1650° C.

In Japanese Patent Publication No. Tokukai 2004-35396 (WO2004/002891A1), it is disclosed that LT crystals are susceptible to a charge-build-up state caused by an electric charge produced by heat or mechanical stress, and for devices which use LT crystals, from a stability viewpoint it is necessary to dissipate this charge, and that with LN crystals, the heat treatment under a reducing atmosphere causes electrical conductivity to increase, allowing charge-build-up to be prevented, and also that the same effects cannot be obtained for LT crystals as were obtained for LN crystals using the same methods.

SUMMARY OF THE INVENTION

An object of the present invention is to provide a LT substrate in which sparks generated by the charge-build-up of an electric charge on the surface of the lithium tantalate (LT) substrate, due to temperature variation sustained during the surface acoustic wave element manufacturing process are prevented, whereby destruction of the comb pattern formed on the surface of the LT substrate and breaks or the like in the LT substrate caused by these sparks is prevented from occurring.

Furthermore, another object of the present invention is to provide a method of manufacturing a LT substrate in which during the photolithographic process, light which passes into the LT substrate does not reflect back from the rear surface of the LT substrate onto the front surface, whereby the resolution of the comb pattern is prevented from being deteriorated.

DETAILED DESCRIPTION OF THE PREFERRED EMBODIMENTS

In order to achieve the above objects, a lithium tantalate (LT) substrate according to the present invention, is made in a process for manufacturing the LT substrate from a lithium tantalate (LT) crystal grown using the Czochralski method, and has a thermal history undergoing at least one heat treatment selected from the following:

in other words;

(1) heat treatment performed on a LT crystal ingot together with carbon powder or in a carbon vessel, under an inert or reducing atmosphere, at a maintained temperature of between 650° C. and 1650° C.;

(2) heat treatment performed on a LT crystal ingot together with Si powder or in an Si vessel, under an inert or reducing atmosphere, at a maintained temperature of between 650° C. and 1400° C.;

(3) heat treatment performed on a LT crystal wafer, together with a metal powder selected from a group consisting of Ca, Al, Ti and Si, under an inert or reducing atmosphere, at a maintained temperature of between 350° C. and 600° C.; and (4) heat treatment performed on a LT crystal wafer together with Zn powder, under an inert or reducing atmosphere, at a maintained temperature of 350° C. or higher and below the melting point of Zn.

Heat treatments (1) and (2) are performed on LT crystals in ingot form before poling is performed, and heat treatments (3) and (4) are performed on wafers, after poling is performed.

With these heat treatments, the wafer or ingot is preferably embedded in the powder, and the treatment preferably lasts 4 hours or longer. After undergoing such heat treatment, the lithium tantalate (LT) substrate of the present invention is blackened.

The present invention achieves an increase in yield for the surface-acoustic wave element manufacturing processes. In other words, sparks resulting from the charge-build-up of an electric charge on the surface of the lithium tantalate (LT) substrate due to temperature variation sustained during the surface acoustic wave element manufacturing process can be prevented, and destruction of the comb pattern formed on the surface of the LT substrate and breaks or the like in the LT substrate caused by these sparks can also be prevented. Furthermore, deterioration in the resolution of the comb pattern, because of light passing into the LT substrate during the photolithographic process being reflected from the rear surface of the LT substrate back onto the front surface, does not occur.

Now, the present invention is further detailed.

The inventors of the present invention found that if electrical conductivity is induced in a LT crystal by a specific method, then even if an electric charge accumulates on the surface of the LT crystal due to pyroelectricity, the charge is neutralized immediately, charge-build-up does not occur, and sparks are not produced, and thus arrived at the present invention related to the aforementioned specific method.

The volume resistivity (electrical conductivity) and color of lithium tantalate (LT) crystals varies according to the oxygen vacancy concentration within the LT crystal. Specifically, if oxygen is taken by Al, for example, and oxygen vacancies are introduced into the LT crystal, this results in excess electrons. Accordingly, because of the need to maintain a charge balance, the excess electrons are trapped by Ta ions, so that the valence value of some of the Ta ions changes from 5+ to 4+, causing electrical conductivity, and at the same time photoabsorption, to occur.

In other words, it is thought that electric conduction is induced because carrier electrons move between $Ta^{5+}$ ions and $Ta^{4+}$ ions. Accordingly, the number of $Ta^{4+}$ ions, which contribute to electric conduction, is proportionate to the amount of oxygen vacancy that is introduced. The electrical conductivity of the crystal is determined by the product of the number of carriers per unit volume and the carrier mobility. Given the same mobility, the electrical conductivity is proportionate to the number of oxygen vacancies. It is thought that color variation due to photoabsorption is caused by the electron level introduced by the oxygen vacancies.

Control of the number of oxygen vacancies can be performed by so-called "treatment under controlled atmosphere", which utilizes the equilibrium between a solid and a gas. The oxygen vacancy concentration of a crystal placed under a specific temperature varies so as to maintain equilibrium with the oxygen potential (oxygen concentration) of the atmosphere under which the crystal is placed. When the oxygen concentration becomes low, the oxygen vacancy concentration increases. Furthermore, even under high temperatures the oxygen vacancy concentration generally increases. Accordingly, in order to increase oxygen vacancy concentration, and increase opacity, preferably a high temperature is used, and the oxygen concentration of the atmosphere is lowered.

Controlling the number of oxygen vacancies can be performed by heat treatment using a so-called reducing agent, utilizing the equilibrium between solids. Preferred reducing agents for LT crystals are C, Zn, Ca, Al, Ti and Si. Furthermore, it is also effective to use a compound of these elements in powder form or oxides of these elements as the reducing agent. Specifically, heat treatment is performed by placing a LT crystal ingot or wafer in a vessel made from these elements, or embedding the ingot or wafer in a powder of these elements. However, the application conditions are very different for ingots and wafers.

With heat treatment performed in a vessel or embedded in a powder, in order to prevent deterioration due to excess oxidation of the elements which form the vessel or powder, the heat treatment is preferably performed under a reducing atmosphere including weak reducibility such as nitrogen gas, inert gas such as Ar gas, nitrogen-hydrogen forming gas, or under a vacuum. At this time, the gas pressure of the atmosphere is preferably at or below atmospheric pressure.

As described above, with the present invention, it is thought that because LT is reduced using a solid reducing agent such as Al, thereby introducing oxygen deficiency, the oxygen is completely consumed by the solid reducing agent such as Al, resulting in an inert gas atmosphere, and subsequently, the LT is losing oxygen due to the unreacted solid reducing agent. However, it is conceivable that oxygen deficiency can occur even when a small amount of oxygen is present in the atmosphere, because the solid reducing agent takes oxygen from the LT by a solid-solid reaction.

Furthermore, the heat treatment temperature is preferably high, but naturally the upper temperature limit is set to the melting point of the LT crystals or the melting point of the element which forms the vessel or the powder, whichever is lower.

Because LT crystals have strong ion-binding properties, the vacancy diffusion speed of LT crystals is relatively fast. However, because changes to the oxygen vacancy concentration require the intra-crystalline diffusion of oxygen, it is necessary to keep the LT crystal under the atmosphere for a fixed time (more than four hours). This dispersion speed depends greatly on temperature, and at room temperature or thereabouts, changes to oxygen vacancy concentration do not occur within a realistic amount of time. Accordingly, to obtain an opaque LT crystal in a short period of time, it is necessary to keep the LT crystal under a low oxygen concentration atmosphere at temperatures high enough to allow sufficiently fast oxygen diffusion.

The heat treatment temperature differs for LT crystal ingots and wafers. This is because the heat treatment temperature applied to ingots and wafers is different, above or below the Curie point. In other words, before poling is performed, heat treatment can be performed at temperatures above the Curie point, but after poling is performed, heat treatment must be performed at temperatures below the Curie point.

If LT crystals in wafer form are treated at temperatures between 650° C. and 1650° C., the Curie point will be exceeded, negating the effects of the poling process performed to obtain a single polarization. Even assuming that it is possible to perform poling of crystals in wafer form, it is an extremely time consuming process, and therefore heat treatment at temperatures between 650° C. and 1650° C. must be applied to ingots and not to the wafers.

On the other hand, although it is not impossible to control pyroelectricity by performing heat treatment of LT crystals in ingot form at temperatures between 350° C. and 600° C., it will take an extremely long heat treatment time to introduce oxygen vacancies all the way to the center of the ingot, and to obtain an even oxygen vacancy concentration throughout the ingot. Accordingly, realistically, heat treatment at temperatures between 350° C. and 600° C. must be applied to wafers and not to the ingots.

After performing treatment at high temperatures, if the LT crystal is cooled quickly, a LT crystal which retains the oxygen vacancy concentration introduced at high temperatures can be maintained at room temperature. The lower limit of processing time can be determined easily by experimentation based on the processing temperatures in the heat treatment methods described above, taking economic efficiency into consideration.

As the optimum conditions, taking into consideration the controllability of the treatment process, the characteristics of the finished substrate, uniformity, and reproducibility of the characteristics, it is effective to use as the sample a wafer cut from an ingot after poling is performed, embed the wafer in a mixed powder of Al and $Al_2O_3$, and perform heat treatment under a nitrogen gas atmosphere or an inert gas atmosphere such as Ar gas, at a temperature below the Curie point of the LT crystal.

The pyroelectric effect is caused by deformation of the lattice which occurs with changes in the crystal temperature. In crystals which have electric dipoles, it is understood that this occurs because the distance between the dipoles varies with the temperature. The pyroelectric effect only occurs with materials that have high electrical resistance. Ion displacement causes a charge to occur on the crystal surface in the dipole direction (the Z direction in a LT crystal), but in a material which has low electrical resistance, this charge is neutralized by the electrical conductivity of the crystal itself. In the case of a normal transparent LT crystal, because the electrical conductivity is at the $10^{-13}$ S/m level, the pyroelectric effect is very noticeable. However, in the case of an opaque LT crystal, because the electrical conductivity increases to approximately $10^{-8}$ S/m (volume resistivity $10^{10}$ Ωcm), pyroelectricity is no longer apparent.

With the present invention, even pale yellow LT crystals and LT crystals that are almost fully colorless and transparent are colorized and opacified (known as blackening), and their electrical conductivity is improved. Because the color tone after colorization and opacification looks a reddish brown color under transmitted light and black under reflected light, this colorization and opacification phenomenon is referred to here as "blackening".

A practical method for determining whether or not the pyroelectricity of the LT crystal is gone after the heat treatment of the present invention is a thermal cycle test, performed so as to imitate the temperature variation sustained by the LT substrate during the actual surface acoustic wave device manufacturing process. When a thermal cycle involving heating from room temperature to 200° C. at a rate of 10° C. per minute, and then cooling to room temperature at a rate of 10° C. per minute is applied to the LT substrate, with LT substrates produced by conventional techniques, sparks are observed on the substrate surface. If the thermal cycle test is performed on a LT crystal which is just grown, it becomes a destructive test in that the generated sparks cause the crystal to crack, and it is therefore difficult to carry out the thermal cycle test during the manufacturing process. On the other hand, with a blackened LT substrate, no sparks are observed at the substrate surface. Accordingly, determining the presence or lack of blackening is useful as a practical method for determining pyroelectricity for LT crystals.

Moreover, blackening can be clearly observed by performing heat treatment for over four hours.

EXAMPLES

Example 1

A LT crystal with a diameter of 4 inches (101.6 mm) was grown using the Czochralski method, from raw materials of congruent composition. The growth atmosphere was a nitrogen-oxygen mixed gas with an oxygen concentration of approximately 3%. The obtained LT crystal ingot was a transparent pale yellow color.

The LT crystal ingot was then embedded in carbon powder, and heat treatment was performed. The heat treatment conditions were 1000° C., for 10 hours, under a nitrogen gas atmosphere.

Subsequently, while maintaining the nitrogen gas atmosphere, cooling to room temperature was performed, and the LT substrate was removed. The obtained LT crystal ingot was an opaque reddish-brown color.

After subjecting the LT crystal ingot to heat treatment to remove thermal strain (nitrogen atmosphere, 1400° C., 40 hours) and poling to obtain a single polarization (nitrogen atmosphere, 650° C., 2 hours), peripheral grinding, slicing, and polishing were performed to obtain a 36° RY (Rotated Y axis) LT substrate. The 36° RY LT substrate was an opaque reddish-brown color. Furthermore, volume resistivity was $10^8$ Ωcm.

A thermal cycle test was then performed in which the obtained 36° RY LT substrate was heated from room temperature to 200° C. at a rate of 10° C. per minute, and then cooled to room temperature at a rate of 10° C. per minute.

As a result, surface potential was not generated, and absolutely no sparking phenomenon was observed. In addition, the Curie point of the 36° RY LT substrate was 603° C., the surface acoustic wave velocity was 4150 m/sec, and the physical properties having an influence on surface acoustic wave element properties were substantially the same as for a conventional 36° RY LT substrate.

Example 2

Treatment and testing was performed substantially in the same manner as in example 1, with the exception that the heat treatment temperature was 650° C. The obtained 36° RY LT substrate was an opaque reddish brown color, with volume resistivity of $10^{10}$ Ωcm. Other characteristics were substantially the same as example 1.

Example 3

Treatment and testing was performed substantially in the same manner as in example 1, with the exception that the heat treatment temperature was 1600° C. The obtained 36° RY LT substrate was an opaque reddish brown color, with volume resistivity of $10^6$ Ωcm. Other characteristics were substantially the same as example 1.

Example 4

Treatment and testing was performed substantially in the same manner as in example 1, with the exception that the LT crystal ingot was placed in a carbon crucible. The obtained 36° RY LT substrate was an opaque reddish brown color, with volume resistivity of $10^8$ Ωcm. Other characteristics were substantially the same as example 1.

Example 5

Treatment and testing was performed substantially in the same manner as in example 1, with the exception that the LT crystal ingot was placed in Si powder, and the heat treatment temperature was 650° C. The obtained 36° RY LT substrate was an opaque reddish brown color, with volume resistivity of $10^{12}$ Ωcm. Other characteristics were substantially the same as example 1.

Example 6

Treatment and testing was performed substantially in the same manner as in example 1, with the exception that the LT crystal ingot was placed in Si powder, and the heat treatment temperature was 1000° C. The obtained 36° RY LT substrate was an opaque reddish brown color, with volume resistivity of $10^{10}$ Ωcm. Other characteristics were substantially the same as example 1.

Example 7

Treatment and testing was performed substantially in the same manner as in example 1, with the exception that the LT crystal ingot was placed in Si powder, and the heat treatment temperature was 1400° C. The obtained 36° RY LT substrate was an opaque reddish brown color, with volume resistivity of $10^8$ Ωcm. Other characteristics were substantially the same as example 1.

Example 8

A LT crystal with a diameter of 4 inches (101.6 mm) was grown using the Czochralski method, from raw materials of congruent composition. The growth atmosphere was a nitrogen-oxygen mixed gas with an oxygen concentration of approximately 3%. The obtained LT crystal ingot was a transparent pale yellow color.

After subjecting the LT crystal ingot to heat treatment to remove thermal strain (air atmosphere, 1400° C., 40 hours) and poling to obtain a single polarization (air atmosphere, 650° C., 2 hours), peripheral grinding, slicing, and polishing were performed to obtain a 36° RY LT substrate. The obtained 36° RY LT substrate was colorless and transparent, with a Curie point of 603° C. and a surface acoustic wave velocity of 4150 m/sec.

The obtained 36° RY LT substrate was then embedded in Al powder, and heat treatment was performed under a nitrogen gas atmosphere at 550° C. for 10 hours. After heat treatment the 36° RY LT substrate was an opaque reddish-brown color. Furthermore, volume resistivity was $10^{10}$ Ωcm.

A thermal cycle test was then performed in which the 36° RY LT substrate after heat treatment was heated from room temperature to 200° C. at a rate of 10° C. per minute, and then cooled to room temperature at a rate of 10° C. per minute.

As a result, surface potential was not generated, and absolutely no sparking phenomenon was observed. In addition, the Curie point of the 36° RY LT substrate was 603° C., the surface acoustic wave velocity was 4150 m/sec, and the physical properties having an influence on surface acoustic wave element properties were substantially the same as for a conventional 36° RY LT substrate.

Example 9

Treatment and testing was performed substantially in the same manner as in example 8, with the exception that the heat treatment temperature was 350° C. The obtained 36° RY LT substrate was an opaque reddish brown color, with volume resistivity of $10^{12}$ Ωcm. Other characteristics were substantially the same as example 8.

Example 10

Treatment and testing was performed substantially in the same manner as in example 8, with the exception that the heat treatment temperature was 600° C. The obtained 36° RY LT substrate was an opaque reddish brown color, with volume resistivity of $10^9$ Ωcm. Other characteristics were substantially the same as example 8.

Example 11

Treatment and testing was performed substantially in the same manner as in example 8, with the exception that the obtained 36° RY LT substrate was placed in a mixed powder of Al 10% and $Al_2O_3$ 90%, and the heat treatment temperature was 350° C. The obtained 36° RY LT substrate was an opaque reddish brown color, with volume resistivity of $10^{12}$ Ωcm. Other characteristics were substantially the same as example 8.

Example 12

Treatment and testing was performed substantially in the same manner as in example 8, with the exception that the obtained 36° RY LT substrate was placed in a mixed powder of Al 10% and $Al_2O_3$ 90%, and the heat treatment temperature was 550° C. The obtained 36° RY LT substrate was an opaque reddish brown color, with volume resistivity of $10^{11}$ Ωcm. Other characteristics were substantially the same as example 8.

Example 13

Treatment and testing was performed substantially in the same manner as in example 8, with the exception that the obtained 36° RY LT substrate was placed in a mixed powder of Al 10% and $Al_2O_3$ 90%, and the heat treatment temperature was 600° C. The obtained 36° RY LT substrate was an opaque reddish brown color, with volume resistivity of $10^{10}$ Ωcm. Other characteristics were substantially the same as example 8.

Example 14

Treatment and testing was performed substantially in the same manner as in example 8, with the exception that the obtained 36° RY LT substrate was placed in a mixed powder of Al 90% and $Al_2O_3$ 10%, and the heat treatment temperature was 350° C. The obtained 36° RY LT substrate was an opaque reddish brown color, with volume resistivity of $10^{12}$ Ωcm. Other characteristics were substantially the same as example 8.

Example 15

Treatment and testing was performed substantially in the same manner as in example 8, with the exception that the obtained 36° RY LT substrate was placed in a mixed powder of Al 90% and $Al_2O_3$ 10%, and the heat treatment temperature was 550° C. The obtained 36° RY LT substrate was an opaque reddish brown color, with volume resistivity of $10^{11}$ Ωcm. Other characteristics were substantially the same as example 8.

Example 16

Treatment and testing was performed substantially in the same manner as in example 8, with the exception that the obtained 36° RY LT substrate was placed in a mixed powder of Al 90% and $Al_2O_3$ 10%, and the heat treatment temperature was 600° C. The obtained 36° RY LT substrate was an opaque reddish brown color, with volume resistivity of $10^{10}$ Ωcm. Other characteristics were substantially the same as example 8.

Example 17

Treatment and testing was performed substantially in the same manner as in example 8, with the exception that the obtained 36° RY LT substrate was placed in a powder of Ca, and the heat treatment temperature was 350° C. The obtained 36° RY LT substrate was an opaque reddish brown color, with volume resistivity of $10^{12}$ Ωcm. Other characteristics were substantially the same as example 8.

Example 18

Treatment and testing was performed substantially in the same manner as in example 8, with the exception that the obtained 36° RY LT substrate was placed in a powder of Ca, and the heat treatment temperature was 600° C. The obtained 36° RY LT substrate was an opaque reddish brown color, with volume resistivity of $10^{10}$ Ωcm. Other characteristics were substantially the same as example 8.

Example 19

Treatment and testing was performed substantially in the same manner as in example 8, with the exception that the obtained 36° RY LT substrate was placed in a powder of Ti, and the heat treatment temperature was 350° C. The obtained 36° RY LT substrate was an opaque reddish brown color, with volume resistivity of $10^{12}$ Ωcm. Other characteristics were substantially the same as example 8.

Example 20

Treatment and testing was performed substantially in the same manner as in example 8, with the exception that the obtained 36° RY LT substrate was placed in a powder of Ti, and the heat treatment temperature was 600° C. The obtained 36° RY LT substrate was an opaque reddish brown color, with volume resistivity of $10^{10}$ Ωcm. Other characteristics were substantially the same as example 8.

Example 21

Treatment and testing was performed substantially in the same manner as in example 8, with the exception that the obtained 36° RY LT substrate was placed in a powder of Si, and the heat treatment temperature was 350° C. The obtained 36° RY LT substrate was an opaque reddish brown color, with volume resistivity of $10^{12}$ Ωcm. Other characteristics were substantially the same as example 8.

Example 22

Treatment and testing was performed substantially in the same manner as in example 8, with the exception that the obtained 36° RY LT substrate was placed in a powder of Si, and the heat treatment temperature was 600° C. The obtained 36° RY LT substrate was an opaque reddish brown color, with volume resistivity of $10^{10}$ Ωcm. Other characteristics were substantially the same as example 8.

Example 23

Treatment and testing was performed substantially in the same manner as in example 8, with the exception that the obtained 36° RY LT substrate was placed in a powder of Zn, and the heat treatment temperature was 350° C. The obtained 36° RY LT substrate was an opaque reddish brown color, with volume resistivity of $10^{12}$ Ωcm. Other characteristics were substantially the same as example 8.

Example 24

Treatment and testing was performed substantially in the same manner as in example 8, with the exception that the obtained 36° RY LT substrate was placed in a powder of Zn, and the heat treatment temperature was 410° C. The obtained 36° RY LT substrate was an opaque reddish brown color, with volume resistivity of $10^{10}$ Ωcm. Other characteristics were substantially the same as example 8.

Example 25

Treatment and testing was performed substantially in the same manner as in examples 1 through 24, with the exception that the heat treatment time was 4 hours. The obtained 36° RY LT substrates were all opaque reddish brown color. The substrate characteristics were respectively substantially the same as for examples 1 through 24.

Comparative Example 1

Processing and testing was performed substantially in the same manner as in examples 1 through 25, with the exception that heat treatment according to the present invention was not performed in the manufacturing process. The obtained crystal ingot was a transparent pale yellow color after each process. The obtained 36° RY LT substrate was colorless and transparent, with a Curie point of 603° C. and a surface acoustic wave velocity of 4150 m/sec.

The obtained 36° RY LT substrate was placed in an SUS vessel, and heat treatment was performed under a nitrogen gas atmosphere, at a temperature of 1000° C., for 8 hours. The 36° RY LT substrate after heat treatment was a pale yellow color, and no blackening was observed. Volume resistivity was $10^{15}$ Ωcm.

A thermal cycle test was then performed in which the 36° RY LT substrate after heat treatment was heated from room temperature to 200° C. at a rate of 10° C. per minute, and then cooled to room temperature at a rate of 10° C. per minute. As a result, an intense sparking phenomenon was observed at the substrate surface.

Comparative Example 2

Processing and testing was performed substantially in the same manner as in comparative example 1, with the exception that the heat treatment temperature was 800° C. The 36° RY LT substrate after heat treatment was a pale yellow color, and no blackening was observed. During the thermal cycle test, an intense sparking phenomenon was observed at the substrate surface.

Comparative Example 3

Processing and testing was performed substantially in the same manner as in comparative example 1, with the exception that the heat treatment temperature was 480° C. The 36° RY LT substrate after heat treatment was a pale yellow color, and no blackening was observed. During the thermal cycle test, an intense sparking phenomenon was observed at the substrate surface.

What is claimed is:

1. A method of manufacturing a lithium tantalate substrate using a lithium tantalate crystal grown using the Czochralski method, comprising the step of heat treating the lithium tantalate crystal in ingot form, which is embedded in carbon powder or in a carbon vessel, at a maintained temperature of between 650° C. and 1650° C., wherein the heat treatment lasts 4 hours or longer.

* * * * *